United States Patent
Randolph et al.

[11] Patent Number: 5,946,262
[45] Date of Patent: Aug. 31, 1999

[54] RAM HAVING MULTIPLE PORTS SHARING COMMON MEMORY LOCATIONS

[75] Inventors: William L. Randolph, Durham; Rhonda Cassada, Hillsborough, both of N.C.

[73] Assignee: Mitsubishi Semiconductor America, Inc., Durham, N.C.

[21] Appl. No.: 08/954,628

[22] Filed: Oct. 20, 1997

Related U.S. Application Data

[60] Provisional application No. 60/040,053, Mar. 7, 1997.

[51] Int. Cl.⁶ .................................................... G11C 8/00
[52] U.S. Cl. ................ 365/230.05; 365/220; 365/189.04
[58] Field of Search .................. 365/230.05, 230.08, 365/189.04, 189.05, 220

[56] References Cited

U.S. PATENT DOCUMENTS

| | | | |
|---|---|---|---|
| 4,731,758 | 3/1988 | Lam et al. | 365/189 |
| 4,815,038 | 3/1989 | Scharrer et al. | 365/189 |
| 4,891,794 | 1/1990 | Hush et al. | 365/189.04 |
| 5,191,553 | 3/1993 | Mizoguchi et al. | 365/189.06 |
| 5,249,284 | 9/1993 | Kass et al. | 395/425 |
| 5,434,818 | 7/1995 | Byers et al. | 365/189.04 |
| 5,566,318 | 10/1996 | Joseph | 395/445 |
| 5,590,087 | 12/1996 | Chung et al. | 365/230.05 |
| 5,680,363 | 10/1997 | Dosaka et al. | 365/230.05 |
| 5,699,317 | 12/1997 | Sartore et al. | 365/230.06 |
| 5,768,178 | 6/1998 | McLaury | 365/230.05 |

*Primary Examiner*—David Nelms
*Assistant Examiner*—Tuan T. Nguyen
*Attorney, Agent, or Firm*—McDermott, Will & Emery

[57] ABSTRACT

A memory having a SRAM, a DRAM and two external IO ports is provided. The SRAM has three IO ports for enabling the external IO ports and the DRAM to access each and every memory cell in the DRAM. Each SRAM cell is provided with two IO ports coupled to the external IO ports, and with an IO port for transferring data to and from the DRAM. The triple-port SRAM cell comprises three input data lines coupled to a latching circuit for writing data supplied from the external IO ports and the DRAM, and three output data lines coupled to the latching system for reading stored data to the external IO ports and the DRAM. Three write address lines and three read address lines provide addressing of the SRAM cell for data writing and reading operations performed by the external IO ports and the DRAM. Each SRAM cell may be read concurrently via all three ports to make the most current data stored in the SRAM accessible from any port at any time.

11 Claims, 5 Drawing Sheets

RAM HAVING MULTIPLE PORTS SHARING COMMON MEMORY LOCATIONS

This application claims the benefit of U.S. Provisional Application No. 60/040,053 filed Mar. 7, 1997.

TECHNICAL FIELD

This application relates to memory devices, and in particular, to a multi-port random access memory (MPRAM) that incorporates a dynamic random access memory (DRAM) and a static random access memory (SRAM), and enables each external input/output (IO) port and the DRAM to access each and every memory cell in the SRAM.

BACKGROUND ART

The development of computer graphics systems creates the need for fast memories capable of storing huge amounts of data, such as 3-D graphics data. Among such memories are cached memories developed to improve DRAM main memory performance by utilizing a faster SRAM cache memory for storing the most commonly accessed data. For example, U.S. Pat. No. 5,566,318 discloses an enhanced DRAM that integrates a SRAM cache memory with a DRAM on a single chip. Sense amplifiers and column write select registers are coupled between the SRAM cache and the DRAM memory array. A column decoder is associated with the SRAM cache for providing access to the desired column of the SRAM. A row decoder is associated with the DRAM memory array to enable access to particular rows of the DRAM. Input/output control and data latches receive data from the SRAM to provide data output via data input/output lines. The current row of data being accessed from the DRAM memory array is held in the SRAM cache memory. Should a cache "miss" be detected, the entire cache memory is refilled from the DRAM memory array over a DRAM-to-cache memory bus.

As a way of improving speed and performance of a RAM, a dual-port RAM has been developed which enables two separate input/output ports to access the memory array. However, the dual-port RAM cannot provide effective control of data input and output because its ports are not interchangeable. For example, data traffic cannot be redistributed between the ports when one of them is overloaded and the other is underloaded.

Referring to FIG. 1, a dual-port RAM 2 comprises IO ports A and B that input and output data to and from the RAM 4, and control input/output operations. A DRAM 4 is used as a main memory, whereas the most commonly accessed data are retained in a SRAM cache memory 6. Data transfers between the ports A and B and the DRAM main memory 4 are carried out via the SRAM 6 split into portions 6A and 6B. A data block supplied via port A is held in the SRAM 6A before being written into the DRAM 4. Similarly, a data block from port B is supplied to the SRAM 6B before being transferred to the DRAM 4.

Port A has access only to the SRAM 6A, whereas port B is able to access only the SRAM 6B. Therefore, the most current data is stored in the DRAM 4 rather than in the SRAM 6. New data entered into one SRAM portion must be written into the DRAM 4. Once the DRAM 4 is updated, the new data is then entered into the other SRAM portion in the next write cycle. Thus, to keep both SRAM portions current, data transfers from one SRAM portion to the DRAM and from the DRAM to the other SRAM portion are required.

To improve the bandwidth of data input/output operations in a multi-port RAM, it would be desirable to enable each port of the RAM to access any SRAM location.

Also, it would be desirable to provide a multi-port RAM having interchangeable ports that enables any of the ports to access the most current data at any time.

DISCLOSURE OF THE INVENTION

Accordingly, one advantage of the invention is in providing a multi-port memory that enables each port to access any SRAM location.

Another advantage of the invention is in providing a multi-port RAM that enables any port to access the most current data at any time.

Another advantage of the invention is in providing a multi-port RAM chip having interchangeable ports.

The above and other advantages of the invention are achieved, at least in part, by providing a memory device arranged on a single chip and having first and second external input/output ports. A main memory may be arranged for storing data. A cache memory having smaller storage capacity than the main memory is coupled to the input/output ports for storing data to be outputted from the ports and for receiving data entered from the ports. Each of the first and second external input ports provides access to every storage cell in the cache memory.

In accordance with a first aspect of the invention, the cache memory has first and second internal input/output ports coupled to the first and second external input/output ports, and a third internal input/output port coupled to the main memory.

In accordance with another aspect of the invention, the cache memory is composed of triple-ported storage cells having first and second internal input/output ports coupled to the first and second external input/output ports, and a third internal input/output port coupled to the main memory.

In accordance with a further aspect of the invention, the first, second and third internal input/output ports of the storage cell are arranged to provide concurrent data reading from the storage cell to the first and second external input/output ports, and the main memory, or to provide concurrent data reading via two of the internal ports, simultaneously with data writing via a third internal port.

In accordance with a method of the present invention, the following steps are carried out to provide data transfer in a multi-port memory chip having a DRAM maim memory, a SRAM cache memory, and first and second input/output ports:

writing data via one of the first and second input/output ports to a predetermined location of said SRAM cache memory, and reading said data from the predetermined location via the first and second input/output ports concurrently.

The DRAM main memory may read data from the predetermined location in the SRAM cache memory simultaneously with reading the data via the first and second input/output ports.

These and other objects and advantages of the present invention will become readily apparent to those skilled in this art from the following detailed description, wherein only the preferred embodiment of the invention is shown and described, simply by way of illustration of the best mode contemplated of carrying out the invention. As will be realized, the invention is capable of other and different embodiments, and its several details are capable of modifications in various obvious respects, all without departing from the invention. Accordingly, the drawings and description are to be regarded as illustrative in nature and not as restrictive.

BRIEF DESCRIPTION OF DRAWINGS

FIG. 6 is an exemplary circuit diagram of the SRAM cell.

BEST MODE FOR CARRYING OUT THE INVENTION

Figure 2:
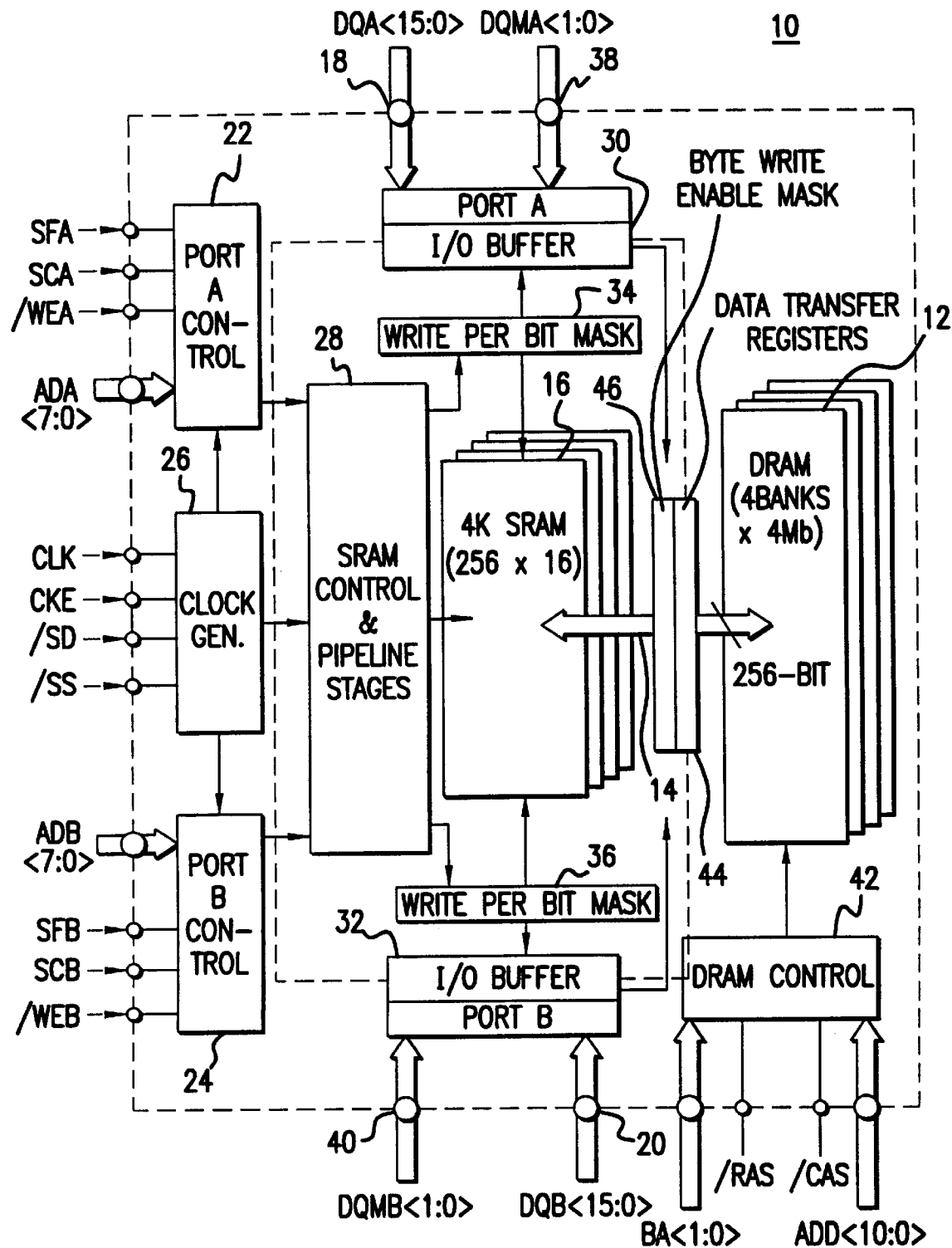
FIG. 2 is a block diagram illustrating architecture of a multi-port RAM chip of the present invention.

Although the invention has general applicability in the field of memory devices, the best mode for practicing the invention is based in part on the realization of a multi-port RAM (MPRAM) 10 illustrated in FIG. 2. The MPRAM 10 arranged on a single chip comprises a DRAM 12 divided into four independently addressable memory banks of 4 Mbits each. Each bank contains a memory array organized as 512 rows by 32 columns by 256 bits. As discussed in more detail later, a single 256-bit global input-output (IO) bus 14 is shared by all 4 banks of the DRAM 12 and connects the DRAM 12 to a SRAM 16.

The 4-kbit SRAM 16 may be organized as 16 lines by 16 words by 16 bits. Each 256-bit transfer between the DRAM 12 and the SRAM 16 replaces or updates one of 16 lines in the SRAM 16.

The MPRAM 10 has two identical and independent 16-bit external IO ports A and B. Each of the external ports A and B provides read and write accesses to each cell of the SRAM 16. IO data pins 18 and 20 are respectively connected to the ports A and B for providing input and output of 16-bit data DQA and DQB.

SRAM control signals SCA and SCB for the ports A and B, respectively, are supplied via a port A control circuit 22 and a port B control circuit 24 to define SRAM operations such as data read or write, and burst termination. Write enable commands /WEA and /WEB for the ports A and B are provided via the port control circuits 22 and 24, respectively, to decode SRAM write operations. Also, the port control circuits 22 and 24 may receive special function commands SFA and SFB, respectively, for enabling a write per bit mode of operation and to provide burst termination.

A clock generator 26 supplied with a master clock signal CLK provides internal clocks for MPRAM operations. All input signals of the MPRAM are referenced to the rising edge of the master clock CLK. A master clock enable signal CKE is fed into the clock generator 26 to enable the internal clock generation. Chip select signals /SD and /SS provide chip select functions for the DRAM 12 and the SRAM 16, respectively.

The port control circuits 22 and 24, and the clock generator 26 are coupled to a SRAM control circuit 28 that controls write and read accesses to the SRAM 16. The data transfer path between each of the IO data pins 18 and 20 and the SRAM 16 for data writing or reading is arranged as a two-stage pipeline.

To write data into the SRAM 16, write commands WA and WB for ports A and B, respectively, may be issued by the SRAM control circuit 28 on the first clock cycle, and the data to be written is supplied on the second clock cycle. The addressed line and word of the SRAM 16 is determined by 8-bit address signals ADA and ADB for ports A and B, respectively, supplied to the port control circuits 22 and 24. For example, the addressed line may be defined by four high-order bits of the address signals ADA and ADB, and the addressed 16-bit word may be determined by four low-order bits of the address signals ADA and ADB.

For reading data from the SRAM 16, read commands RA and RB may be issued by the SRAM control circuit 28 on the first clock cycle, the data is accessed at the second clock's rising edge, and the data is made valid on the third clock cycle. Similarly to writing operations, the addressed line and word of the SRAM 16 is determined by the address signals ADA and ADB for ports A and B, respectively. For example, the addressed line may be defined by four high-order bits of the address signals ADA and ADB, and the addressed 16-bit word may be determined by four low-order bits of the address signals ADA and ADB.

As discussed in more detail below, the ports A and B are independent and may simultaneously provide reading and writing data from or to any location in the SRAM 16. However, the user is prevented from writing to the same SRAM cell from both ports simultaneously. IO buffers 30 and 32 are coupled to the ports A and B, respectively, to buffer data during read and write operations.

Write per bit mask registers 34 and 36 connected to the IO buffers 30 and 32, respectively, are used to perform masked write operations from ports A and B. The SRAM control circuits issues masked write commands MWA and MWB for ports A and B, respectively, to mask the DQA and DQB data being read from the SRAM 16 or written into the SRAM 16. Pins 38 and 40 supplies two-bit mask control data DQMA and DQMB for ports A and B, respectively. When either bit of the mask control data DQMA and DQMB is set high, the DQA and DQB data, respectively, being read or written is masked. For example, the high-order bit of the mask control data DQMA and DQMB respectively controls the upper byte of the DQA and DQB data. The low-order bit of the mask control data DQMA and DQMB may respectively control the lower byte of the DQA and DQB data. Load mask register commands LMPA and LMRB may be issued by the SRAM control circuit 28 for ports A and B, respectively, to load the write per bit registers 34 and 36.

The MPRAM 10 allows the SRAM 16 and DRAM 12 to operate concurrently. A DRAM control circuit 42 forms DRAM control commands defined by control signals /RAS and /CAS. A 2-bit bank address command BA selects one of four DRAM banks. An 11-bit address command ADD select DRAM row and column addresses, DRAM transfer operations and lines in the SRAM 16 from which data may be transferred to the DRAM 12 or to which data may be transferred from the DRAM 12. For example, nine low-order bits of the ADD command may select DRAM row address, five low-order bits may select DRAM column address, two bits of the ADD command may be used to define DRAM transfer operation, and four high-order bits may select one of sixteen lines in the SRAM.

The DRAM control circuit 42 forms a DRAM read transfer command DRT to transfer 1 of 32 blocks of data indicated by the ADD command into 1 of 16 lines in the SRAM 16. A DRAM write transfer command DWT is formed by the DRAM control circuit 42 to transfer data from 1 of 16 SRAM lines indicated by the ADD command to 1 of 32 blocks in the DRAM 12.

Data transfer registers 44 are arranged between the DRAM 12 and SRAM 16 to support data transfer between the DRAM 12 and SRAM 16. A 32-bit byte write enable mask register 46 is used to mask DRAM write transfers. The register 46 may be loaded from either port A or port B when the load mask register command LMR is issued. Each bit in the register 46 masks a byte of the 256-bit global IO bus 14. The byte write enable mask register 46 and write per bit mask registers 34 and 36 may be bypassed during writes to the DRAM 12 and SRAM 16, respectively.

The MPRAM 10 has a programmable burst mode that allows the user to select burst lengths of 1, 2, 4 and 8 for bursts of data being written from the ports A and B to the SRAM 16 or bursts of data being read from the SRAM 16 to the ports A and B. Sequential or interleave bursts may be selected. A set mode register command SMR issued by the DRAM control circuit 42 enables the burst length and type to be programmed in an internal mode register (not shown). A mode register code (MRC) to be programmed in the mode register may be entered using the ADD command. The MRC is stored in the mode register until it is overwritten by the next SMR command, or until power is no longer supplied to the MPRAM 10. The SMR command may be issued when the DRAM 12 and SRAM 16 are in an idle state. Burst terminate commands BTA and BTB may be issued by the SRAM control circuit 28 to terminate burst sequences from or to the ports A and B, respectively.

Figure 3:
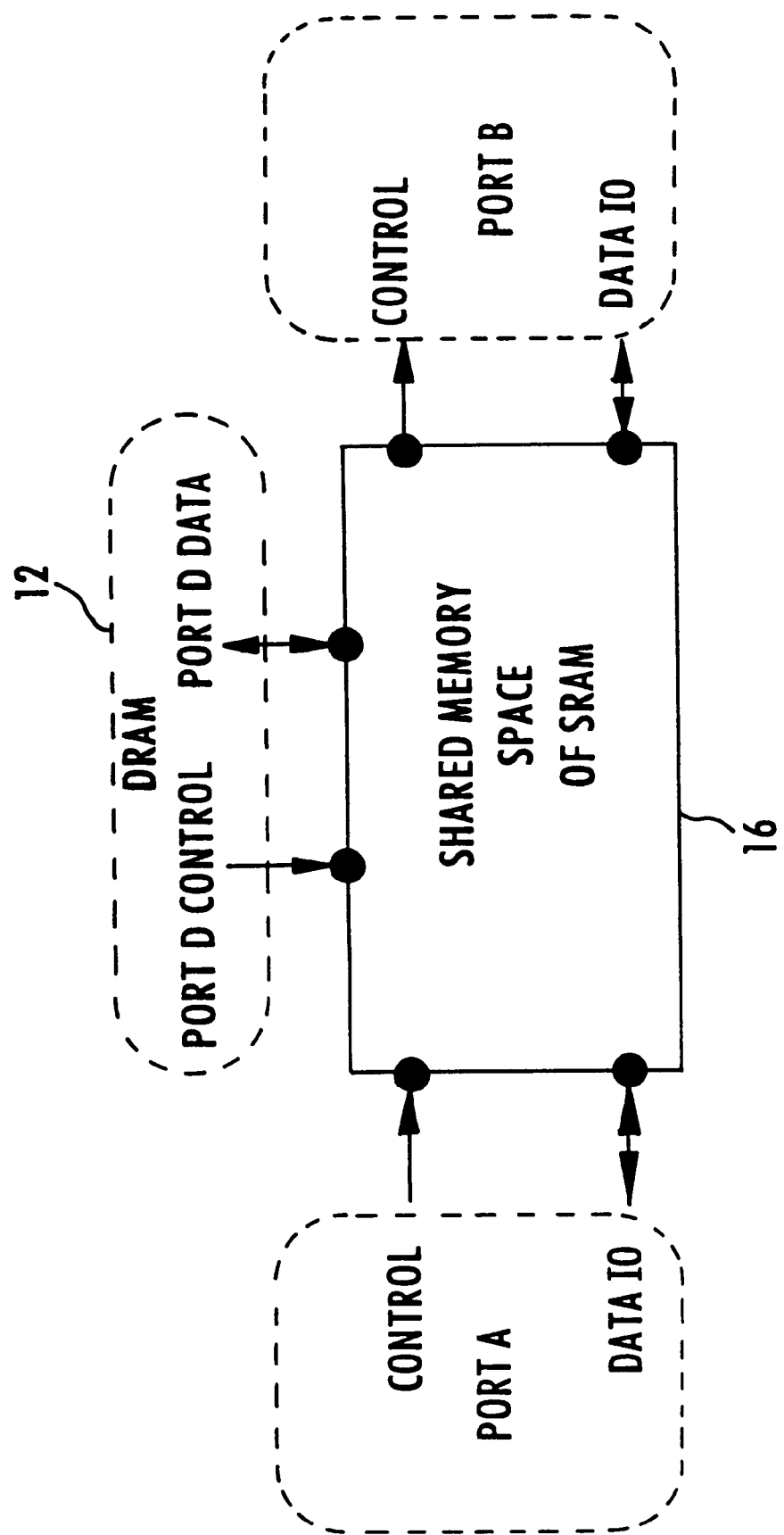
FIG. 3 is a block diagram schematically showing the arrangement of a multi-port RAM with a shared SRAM of the present invention.

FIG. 3 schematically illustrates access to the SRAM 16 for the ports A and B, and the DRAM 12. Data input/ output to and from the SRAM 16 for external ports A, and B may be provided via IO buffers 30 and 32, respectively. The port A and port B control circuits 22 and 24 may control the data input/output for external ports A and B, respectively. Bi-directional data transfer between the DRAM 12 and the SRAM 16 may be carried out via the global IO bus 14 in accordance with control signals produced by the DRAM control circuit 42. Data transfers between the SRAM 16 and the DRAM 12 via the global IO bus 16 are disclosed in more detail in our copending application Ser. No. 08/937,004, entitled "MULTI-PORT RAM HAVING SHARED GLOBAL BUS" filed Sep. 24, 1997, and incorporated by reference.

The SRAM 16 is provided with SRAM ports A, B, and D for enabling the external ports A and B, and the DRAM 12 to concurrently access the SRAM memory space. For example, 16-bit data DQA and DQB are respectively transferred between the IO data pins 18 and 20 of the external ports A and B, and the SRAM ports A and B. Read and write SRAM accesses from the external ports A and B via the SRAM ports A and B are controlled by control and address signals supplied to the port A control circuit 22 and port B control circuit 24, respectively.

The SRAM port D supports data transfer between the SRAM 16 and the DRAM 12. For example, the SRAM port D may be coupled to the global IO bus 14. The DRAM control circuit 42 controls read and write SRAM accesses via the port D.

Each of the SRAM ports A, B and D may provide access to each and every memory cell in the SRAM 16. For example, a memory cell in the SRAM 16 may be read concurrently via all three SRAM ports A, B and D. Also, each cell may be read concurrently via any two of the SRAM ports A, B, and D, while it is being written via the third SRAM port.

Figure 4:
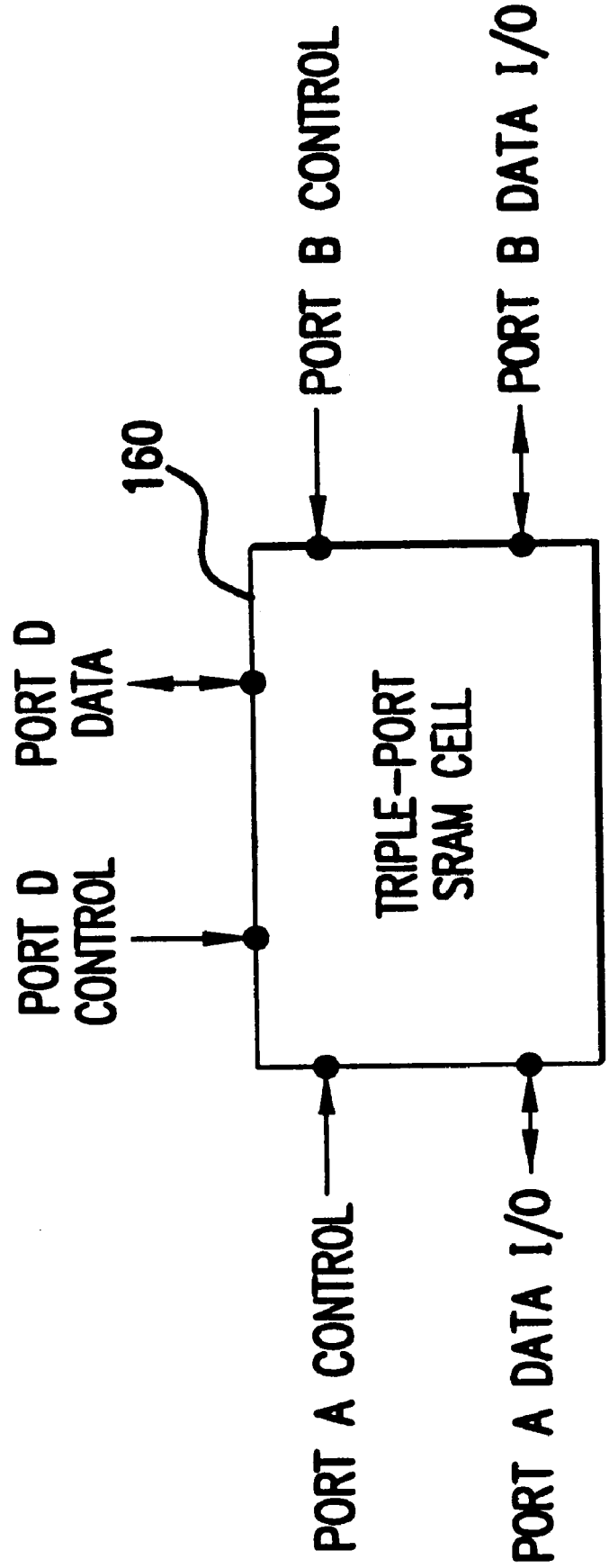
FIG. 4 illustrates ports of each SRAM cell.

Referring to FIG. 4, each storage cell 160 of the SRAM 16 has three ports A, B and D, each of which is provided with a data IO line, and a control line. The data IO lines of the ports A, B, and D are respectively coupled to the data IO buses of the A, B, and D ports of the SRAM 16. The control lines of the ports A, B, and D are respectively connected to the control buses of the SRAM ports A, B, and D.

Figure 5:
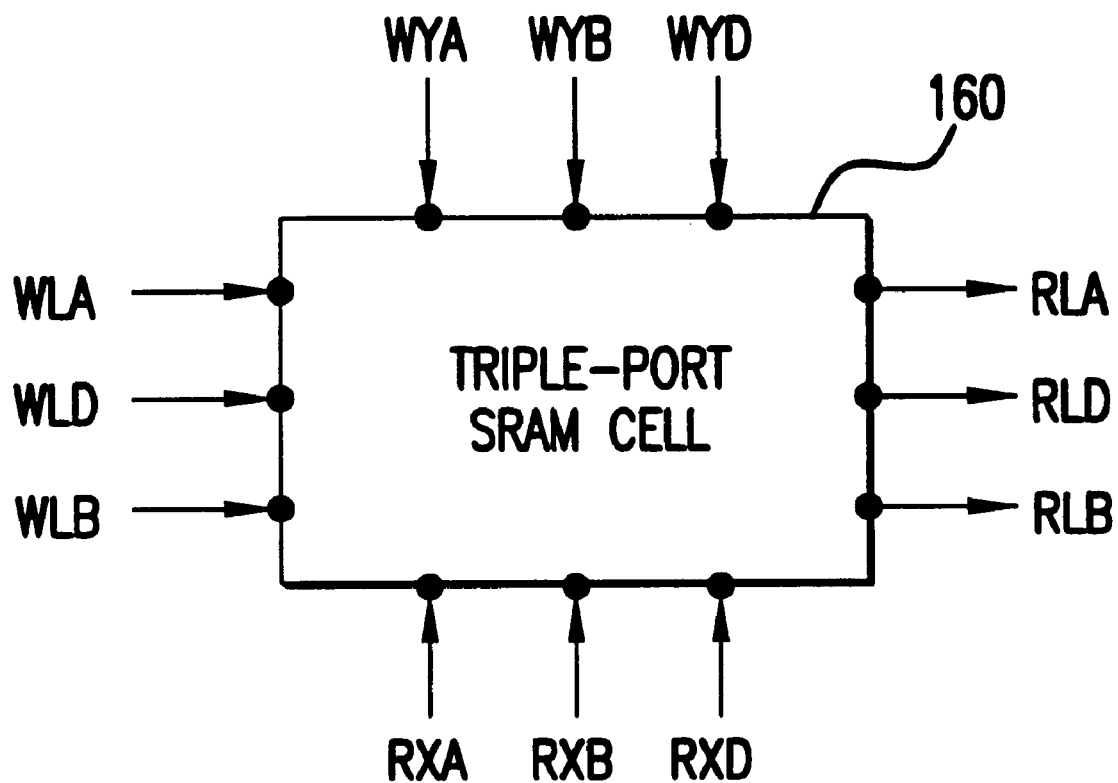
FIG. 5 shows data and address lines of the SRAM cell.

As shown in FIG. 5, each SRAM cell 160 has read and write data paths, and read and write address control lines. Write address lines WYA, WYB, and WYD provide write address signals for cell ports A, B, and D, respectively. Read address lines RXA, RXB, and RXD are used for supplying read address signals for cell ports A, B, and D, respectively. Input data lines WLA, WLB and WLD enable data from external ports A, and B and the DRAM 12 to be written into the SRAM cell 160 via cell ports A, B and D. Output data lines RLA, RLB and RLD support reading data from the cell 160 to the external ports A, and B and the DRAM 12 via cell ports A, B, and D.

For example, data to be written into the cell 160 from external port A is placed on the input data line WLA. The write address signal provided on the write address line WYA for addressing the cell 160 is generated by the port A control circuit 22 based on the ADA address signal.

To perform reading data from external port A, the port A control circuit 22 generates a read address signal based on the ADA address signal. The read address signal is provided on the read address line RXA for addressing the cell 160. The read data is transferred to external port A via the output data line RLA. Reading and writing accesses to the cell 160 from external port B are performed in a similar manner using the output data line RLB, read address line RXB, input data line WLB and write address line WYB.

The DRAM 12 writes and reads data to and from the cell 160 via the input data line WLD and output data line RLD, respectively. To perform data reading, the cell 160 is addressed via the read address line RXD. The read address signal is produced by the DRAM control circuit 42 based on the ADD address signal. The write address signal to the cell 160 formed by the DRAM control circuit 42 based on the ADD address is provided on the write address line WYD.

An exemplary arrangement of the triple-port SRAM cell 160 is illustrated in FIG. 6. The cell 160 may comprise input pass transistors Q1, Q2 and Q3 respectively connected between the input data lines WLA, WLB and WLD, and a latching circuit formed by inverters I1, I2, and I3 for latching data. The inverters I1 and I2 are cross coupled. The inverter I3 is coupled to the output of the inverter I1. Each of the inverters I1–I3 may be provided by a pair of MOS transistors.

Output pass transistors Q4, Q5, and Q6 are respectively connected between the latching circuit, and the output data lines RLA, RLB and RLD. The pass transistors Q1, Q2, and Q3 have their gates respectively connected to the write address lines WYA, WYB and WYD. The pass transistors Q4, Q5, and Q6 have their gates respectively connected to the read address lines RXA, RXB, and RXD. For example, MOS transistors may be used as the input and output pass transistors.

When one of external ports A, and B or the DRAM 12 initiates writing data to the SRAM cell 160, the corresponding write address signal activates one of the input pass transistors Q1–Q3 to allow data supplied to one of the input data lines to flow into the latching circuit I1–I3. Simultaneous write accesses to a single SRAM cell 160 from more than one port may provide invalid data. Therefore, the MPRAM 10 is prevented from concurrent writing to the same SRAM cell from both external ports A, and B, or from the DRAM 12 and one of the external ports.

The read address signals may activate one or more output pass transistors Q4–Q6 to enable data to pass from the latching circuit to the corresponding output data lines. Thus, the triple-port SRAM cell 160 may support multiple read operations performed concurrently.

Because only one SRAM operation may be performed at any given time from any one of ports A, B, and D, the triple-port SRAM cell 160 can support up to three operations carried out concurrently. For example, port A may write to the cell 160, concurrently with reading from the cell 160 to ports A and D.

Thus, the triple-port SRAM cell 160 enables the MPRAM 10 to read or write SRAM data to or from the DRAM 12 via port D, concurrently with performing read and write accesses to the SRAM 16 from the external memory controller via ports A and B. Therefore, DRAM and SRAM operations can be carried out simultaneously. A triple-port cell for the SRAM 16 is disclosed in more detail in our copending application Ser. No. 08/936,431, entitled "MULTI-PORT RAM HAVING TRIPLE-PORT SRAM CELLS" filed Sep. 24, 1997, and incorporated by reference.

Figure 1:
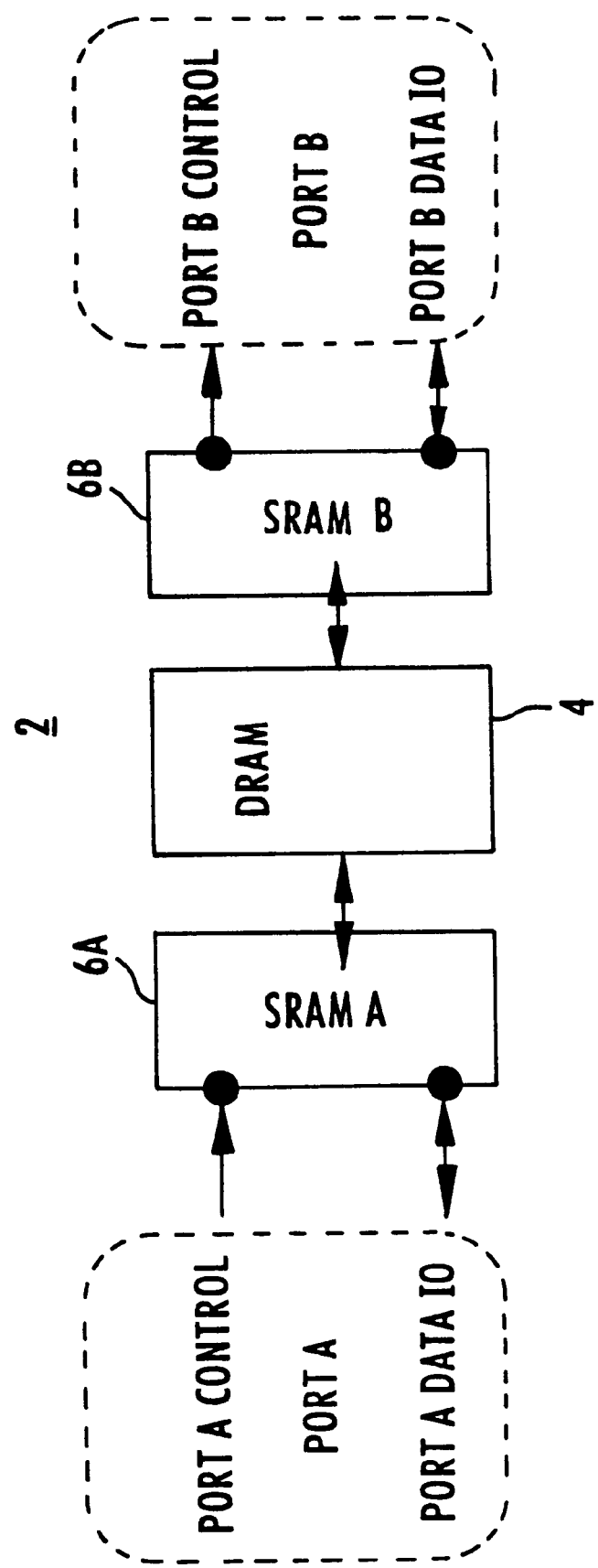
FIG. 1 is a block diagram illustrating a conventional dual-port RAM with a split SRAM.

Since the MPRAM 10 provides a common SRAM space for the external ports A and B, the IO bandwidth of the MPRAM may be substantially improved compared to the conventional RAM shown in FIG. 1. For example, in a read-modify-write cycle, an external memory controller coupled to the external ports A and B may modify data in the SRAM 16 read via any of the external ports A and B. The modified data may be written to the SRAM 16 via any of the ports A and B. It is assumed that two sequential write commands are issued for the same address in the SRAM 16. One of the commands requires a data element to be written via the port A, and the other command causes the modified data element to be written at the same address via the port B.

The MPRAM 10 enables the both ports A and B to access the most current data element as soon as this data element is written to the SRAM 16. By contrast, the dual-port RAM 2 with a split SRAM memory shown in FIG. 1 allows only one port to access the most current data element in the SRAM. The data element should be transferred to the DRAM, and then to the second portion of the SRAM to be accessible from the second port. Accordingly, the bandwidth of data input/output operations in the MPRAM 10 with a shared SRAM is substantially improved compared to the RAM 2 with a split SRAM.

There, accordingly, has been described a memory having a SRAM, a DRAM and two external IO ports. The SRAM has three IO ports for enabling the external IO ports and the DRAM to access each and every memory cell in the DRAM. Each SRAM cell is provided with two IO ports coupled to the external IO ports and with an IO port for transferring data to and from the DRAM. The triple-port SRAM cell comprises three input data lines coupled to a latching circuit for writing data supplied from the external IO ports and the DRAM, and three output data lines coupled to the latching system for reading stored data to the external IO ports and the DRAM. Three write address lines and three read address lines provide addressing of the SRAM cell for data writing and reading operations performed by the external IO ports and the DRAM. Each SRAM cell may be read concurrently via all three ports to make the most current data stored in the SRAM accessible from any port at any time.

What is claimed is:

1. A multi-port memory device comprising on a single chip:

first and second external input/output ports for providing data input and output, a main memory for storing data, and a cache memory having smaller storage capacity than said main memory, and coupled to said first and second external input/output ports for storing data to be outputted from said first and second external input/output ports, and for receiving data entered from said first and second external input/output ports, each of said first and second external input/output ports providing access to every storage cell in said cache memory.

2. The multi-port memory of claim 1, wherein said cache memory has first and second internal input/output ports coupled to said first and second external input/output ports.

3. The multi-port memory of claim 2, wherein said cache memory has a third internal input/output port coupled to said main memory.

4. The multi-port memory of claim 1, wherein said every storage cell in said cache memory has first and second internal input/output ports coupled to said first and second external input/output ports.

5. The multi-port memory of claim 4, wherein said every storage cell in said cache memory has a third internal input/output port coupled to said main memory.

6. The multi-port memory of claim 5, wherein said first, second and third internal input/output ports of said every storage cell are arranged to provide concurrent data reading from said every storage cell to said first and second external input/output ports, and said main memory.

7. The multi-port memory of claim 5, wherein said first, second and third internal input/output ports of said every storage cell are arranged to provide concurrent data reading via two of said first, second and third internal input/output ports, simultaneously with data writing via one of said first, second and third internal input/output ports.

8. The multi-port memory of claim 1, wherein said cache memory comprises SRAM.

9. The multi-port memory of claim 8, wherein said main memory comprises DRAM.

10. In a memory device having first and second input/output ports, a SRAM cache memory, a DRAM main memory, a method of data transfer comprising the steps of:

writing data via one of said first and second input/output ports to a predetermined location of said SRAM cache memory, and reading said data from said predetermined location via said first and second input/output ports concurrently.

11. The method of claim 10, further comprising the step of reading said data from said predetermined location to said DRAM main memory, simultaneously with reading said data via said first and second input/output ports.

* * * * *